United States Patent [19]

Levi

[11] Patent Number: 4,926,221

[45] Date of Patent: May 15, 1990

[54] BIPOLAR HOT ELECTRON TRANSISTOR

[75] Inventor: Anthony F. J. Levi, Summit, N.J.

[73] Assignee: AT&T Bell Laboratories, Murray Hill, N.J.

[21] Appl. No.: 403,003

[22] Filed: Sep. 7, 1989

Related U.S. Application Data

[63] Continuation of Ser. No. 241,279, Sep. 7, 1988, abandoned.

[51] Int. Cl.⁵ ............................................. H01L 29/72
[52] U.S. Cl. ......................................... 357/16; 357/4; 357/34
[58] Field of Search ............................... 357/4, 16, 34

[56] References Cited

U.S. PATENT DOCUMENTS 4,672,404  6/1987  Ankri et al. .......................... 357/16
4,772,934  9/1988  Cunningham et al. ............... 357/16

FOREIGN PATENT DOCUMENTS 2128026  4/1984  United Kingdom ................. 357/16

OTHER PUBLICATIONS

*IEEE Spectrum*, Feb. 1986, "The Quest for Ballistic Action", by T. E. Bell, pp. 36–38.
*IEEE Spectrum*, Feb. 1986, "Ballistic ELectrons in Compound Semiconductors", by L. F. Eastman, pp. 42–45.
*Physical Review B*, vol. 1(5), 1 Mar. 1970, "Lindhard Dielectric Function in the Relaxation-Time Approximation", pp. 2362–2363, by N. D. Mermin.
*Physical Review B*, vol. 36(2), 15 Jul. 1987, "Realization of the Esaki-Tsu-Type Doping Superlattice", by E. F. Schubert et al., pp. 1348–1351.
*Physical Review Letters*, vol. 60(25), 20 Jun. 1988, "Observation of Strong Ordering in $Ga_xIn_{1-x}P$ Alloy Semiconductors", by A. Gomyo et al., pp. 2645–2648.

*Primary Examiner*—William D. Larkins
*Attorney, Agent, or Firm*—David I. Caplan

[57] ABSTRACT

A hot electron transistor (HET) comprising features that can result in substantially improved device characteristics is disclosed. Among the features is a highly doped (typically more than about $10^{20}$ cm$^{-3}$) thin base region, a thin (typically less than about 100 nm) collector depletion region, and a highly doped (typically more than about $10^{19}$ cm$^{-3}$) collector contact region. Ballistic transport through the base region is possible, despite the high doping level, because the inelastic scattering rate can be relatively low in at least some highly doped compound semiconductors such as GaAs, AlGaAs, InGaAs, or InP. The elastic scattering rate in the base region can be relatively low if the dopant atoms have an appropriate non-random distribution. Techniques for achieving such a distribution are disclosed. Transistors according to the invention are expected to find advantageous use in applications that demand high speed, e.g., in repeaters in high capacity optical fiber transmission systems.

10 Claims, 2 Drawing Sheets

BIPOLAR HOT ELECTRON TRANSISTOR

This application is a continuation application Ser. No. 241,279, filed on Sept. 7, 1988, now abandoned.

FIELD OF THE INVENTION

This application pertains to the field of active semiconductor devices. In particular, it pertains to bipolar transistors in which at least a substantial fraction of the current is carried by hot electrons.

BACKGROUND OF THE INVENTION

It has been known for some time that a hot electron transistor could potentially be operated at frequencies in excess of those achievable with conventional (diffusive) transistors. See, for instance, T. E. Bell, *IEEE Spectrum*, February 1986, pp. 36-38, incorporated herein by reference. Various types of hot electron transistors (HET) have been proposed. This application is concerned with one particular class of such transistors, namely, heterojunction bipolar HETs. For a brief review, see L. F. Eastman, ibid, pp. 42-45, also incorporated herein by reference.

The flow of electrons from emitter to collector in a bipolar transistor is controlled by varying the emitter/base barrier potential by means of an applied voltage $V_{eb}$, and is also a function of an externally applied voltage $V_{bc}$ between base and collector. Under normal operating conditions, $V_{bc}$ reverse biases the base/collector junction. Electrons injected from the emitter into the base of a bipolar HET have energy substantially greater than the thermal energy of the ambient electrons in the base. These "hot" electrons ideally traverse the base without undergoing significant scattering. If the base/collector barrier is caused to be lower than the hot electron energy then some of the hot electrons can cross the barrier, be transmitted through the depletion region of the collector, and enter the sea of conduction electrons in the collector contact region.

As will be readily understood by those skilled in the art, various difficulties have to be overcome before a device of this type can function as a practical HET. Among these is the difficulty of achieving substantially complete hot electron transport through the base, and, desirably, also through the depletion region of the collector.

Two recently filed U.S. patent applications (Ser. No. 871,494, filed June 6, 1986 by J. R. Hayes et al. and Ser. No. 074,127, filed July 17, 1987, Pat. No. 4829343 by A. F. J. Levi), both incorporated herein by reference, disclose means for achieving improved HETs. However, in view of the general desirability of improved characteristics such as larger $\beta$ and high cut-off frequency, means for achieving further improvements in HET characteristics would be of considerable significance. This application discloses HETs comprising such means.

DEFINITIONS

Electron transport in a crystal is herein defined to be "ballistic" if, in addition to its possible interaction with an accelerating electric field, the electron interacts substantially only with the static part of the periodic lattice potential. Electron transport thus may be ballistic even though the electrons undergo some small angle scattering and/or small energy change.

A conduction electron herein is considered to be a "hot" electron in a given semiconductor region if its energy E is substantially greater than the ambient thermal energy $k_BT$. Typically, $E \gtrsim 10 k_BT$, where $k_B$ is the Boltzmann constant, and T is the absolute temperature of the lattice.

A "hot electron" transistor (HET) is a transistor whose operative characteristics are in substantial part determined by the transport of hot electrons through the transit region of the transistor, with minimal scattering of the hot electrons in the transit region.

The "transit region" of a HET herein is that portion of the HET through which substantial hot electron transport takes place, or is intended to take place. For instance, in a bipolar transistor, the transit region consists of the base and the collector depletion region. In order to have the possibility of significant hot electron transport in a HET, the width of the transit region has to be less than the mean-free path of the hot electrons in the material.

The "ambient" charge carriers are those charge carriers (electrons or holes) that are essentially in thermal equilibrium with the lattice. For instance, in n-p-n bipolar HETs the ambient charge carriers in the base are holes.

Electron scattering is herein considered to be "elastic" or "inelastic" if the associated change in energy of the electron is, respectively, less or greater than $\Delta = h/2\pi\tau_{holes}$, wherein h is Planck's constant and $\tau_{holes} = m^*\mu/e$, where $m^*$ is the effective hole mass, $\mu$ is the hole mobility, and e is the electron charge. (See, for instance, N. D. Mermin, *Physical Review B*, Vol. 1, pp. 2362-2363, 1970.) Exemplarily, in GaAs with a p-type impurity concentration of $2 \times 10^{20}$ cm$^{-3}$, $\mu$ is about 50 cm$^2$/V-sec, yielding $\Delta$ of about 46 meV.

THE INVENTION

In a broad sense, I am herein teaching design features that can be used to produce HETs having improved characteristics. For instance, the inventive features can result in compound semiconductor bipolar HETs that are capable of operation at frequencies higher than those attainable with prior art transistors. Such transistors can be used in a variety of applications, e.g., in repeaters in high bit-rate optical fiber transmission systems.

HETs of interest herein generally have geometries similar to those of prior art HETs, although typically critical dimensions such as $Z_b$ and $Z_c$ (see FIG. 2) are scaled down. Inventive HETs comprise an electron emission region (the first region), an electron collection region (the third region), and a second region that is intermediate the first and third regions and forms interfaces therewith. The first region comprises an emitter layer, and the second region comprises a base layer, with, typically, the emitter layer contacting the base layer and forming the emitter/base interface therewith. The base layer is typically also in contact with third region material and forms the base/collector interface therewith. The first, second and third regions each generally consist of one or more layers of compound semiconductor material, with the composition of the base layer differing at least from that of the emitter layer. In many cases the second region material will be basically the same as the third region material, with the second and third region materials containing different dopants and/or differing in dopant concentration.

HETs of interest herein also comprise means for making electrical contact with the first, second and third region, respectively, and means for injecting hot electrons from the first into the second region. At least a substantial fraction (advantageously >90%) of the injected hot electrons transit the second region without substantial energy loss and cross the base/collector interface. The injected hot electrons have average energy $E_i$.

As will be readily appreciated by those skilled in the art, in a HET a substantial portion of the hot electrons that are injected into the second region must traverse the second region and the remainder of the transit region without becoming thermalized through inelastic scattering and, desirably, without undergoing appreciable elastic or inelastic scattering. This suggests as a desirable design goal transistors having relatively low dopant concentration in the transit region. On the other hand, a high cut-off frequency can only be achieved if the sheet resistance $R_b$ associated with the application of a control signal to the second region is relatively low. Low $R_b$ requires a high dopant concentration in the second region. Thus there exist conflicting requirements which have resulted in design compromises in the prior art and prevented desirable scaling down of device size.

Figure 1:
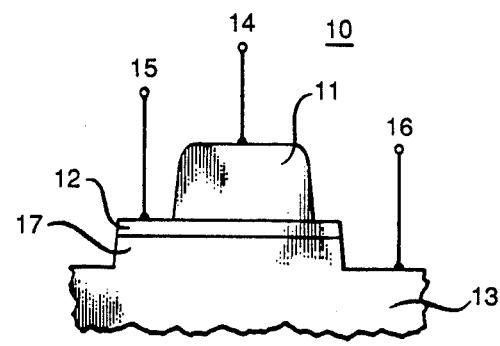
FIG. 1 schematically depicts a device according to the invention.

FIG. 1 schematically depicts a HET 10 according to the invention, wherein numerals 11, 12, and 13 refer, respectively, to the first, second, and third regions of the transistor. In many cases these regions can be directly identified with emitter, base, and collector, respectively. Each of the regions may comprise more than one layer of semiconductor material. Portion 17 of the third region is a collector depletion region, and numerals 14, 15, and 16 refer to means for making electrical contact to the first, second, and third regions, respectively. Transistors according to the invention may be discrete devices but are more likely part of an integrated circuit, as will be appreciated by those skilled in the art. Discrete transistors as well as the integrated circuits can be produced by known methods, typically including molecular beam epitaxy (MBE) and/or metal-organic chemical vapor deposition (MOCVD).

Figure 2:
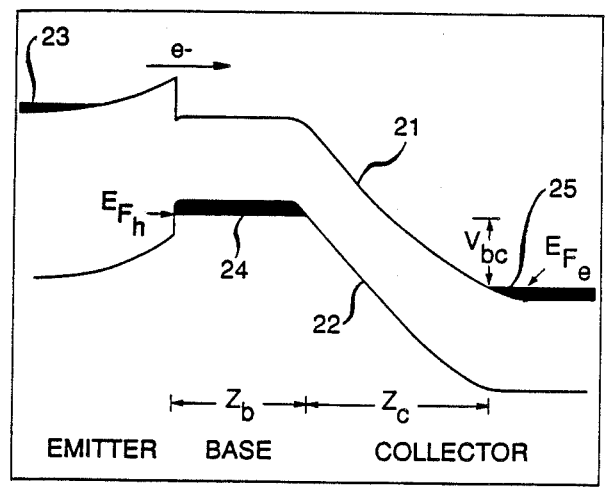
FIG. 2 shows schematically some features of the conduction band structure of a device according to the invention.

FIG. 2 schematically shows the energy diagram associated with an exemplary inventive HET under bias. Such diagrams are well understood by those skilled in the art. The regions labeled "emitter", "base", and "collector" refer to the first, second, and third regions of the transistor, respectively, and numerals 21 and 22 refer to the lower conduction band edge and the upper valence band edge, respectively. The arrow indicates the direction of hot electron flow, with numeral 23 referring to the sea of conduction electrons in the emitter region, 24 to the holes in the valence band in the base region, and 25 to the sea of conduction electrons in the collector contact region. The base region is of thickness $Z_b$, and the collector depletion region of thickness $Z_c$. $Z_b$ and $Z_c$ together are the thickness of the transit region, which is advantageously kept to a minimum consistent with other design parameters such as $R_b$. $E_{F,h}$ and $E_{F,e}$ are, respectively, the Fermi energy of the holes in the base region and of the electrons in the collector region. $V_{bc}$ is the potential difference, due to an externally applied voltage, between base and collector.

I have made a quite unexpected discovery which will permit the practitioner to design HETs capable of improved high frequency behavior. As a consequence of the newly discovered property, the above discussed conflicting requirements on the doping of the second region are at least far less severe then previously thought. In particular, I have discovered that the inelastic scattering rate $1/\tau_{in}$ associated with hot electrons of a given energy $E_i$ in many semiconductor materials of interest for HETs (e.g., GaAs, AlGaAs, $In_{0.53}Ga_{0.47}As$) goes through a maximum as a function of the average density of dopant atoms ($n_b$), and can be significantly lower than its value at $n_{b,max}$ if $n_b > n_{b,max}$, where $n_{b,max}$ is the density of dopant atoms at the maximum of $1/\tau_{in}$. The inelastic scattering time is designated as $\tau_{in}$.

Figure 3:
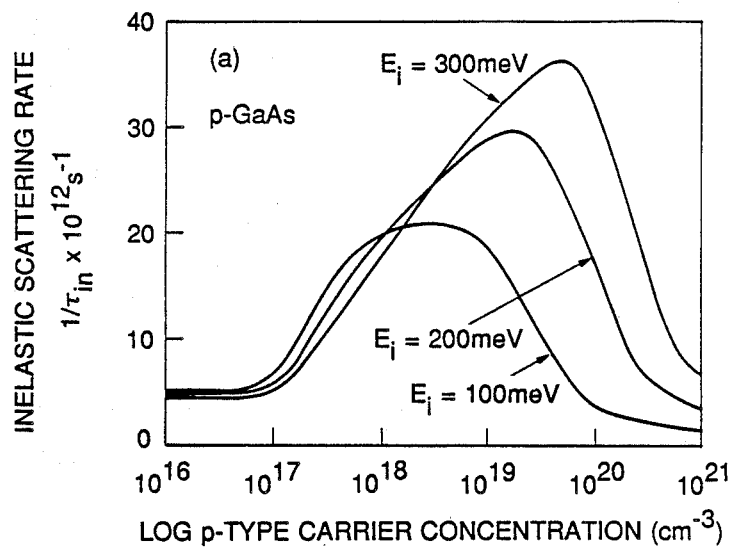
FIGS. 3 and 4 show exemplary curves, respectively, of the inelastic and elastic electron scattering rates in p-type GaAs as a function of dopant concentration.

The inelastic scattering rate for hot electrons in p-doped GaAs is shown in FIG. 3 as a function of dopant level. As can be seen, the scattering rate is a function of $E_i$ for most dopant levels of interest and has a pronounced maximum. For high doping levels (e.g., $n_b \gtrsim 10^{20}$ cm$^{-3}$) the inelastic scattering rate can actually be less than for low doping levels (e.g., $n_b \lesssim 10^{17}$ cm$^{-3}$). Similar results apply to other compound semiconductor materials useful in the practice of the invention. Thus, in devices according to the invention the average dopant concentration in the base typically is at least $10^{20}$ cm$^{-3}$, frequently $2 \times 10^{20}$ cm$^{-3}$ or greater.

As a consequence of the unexpected decrease of the inelastic scattering rate for high doping levels, it is possible to design HETs that have both relatively low $R_b$ and low $1/\tau_{in}$, two characteristics that, up to now, practitioners did not expect to be obtainable simultaneously. This can be achieved by selecting the doping level in the second region such that $n_b > n_{b,max}$, for the given operative value of $E_i$. The value of $n_{b,max}$ for a given semiconductor material can be determined by a calculation of the type used to produce the results shown in FIG. 3, or it can be determined experimentally, by carrying out I/V measurements at low temperatures on a series of otherwise identical HETs that differ only with regard to $n_b$.

Figure 4:
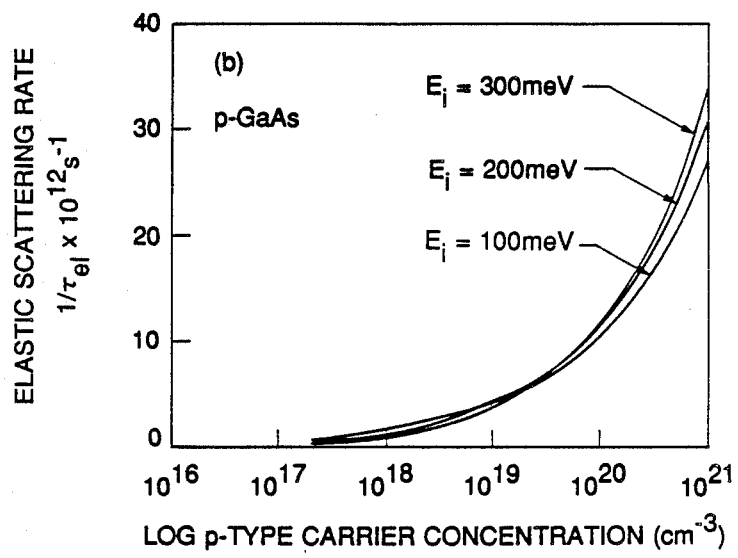

It is to be understood that the above remarks pertain to the inelastic scattering rate. The behavior of the elastic scattering rate in GaAs as a function of the level of randomly distributed p-type dopant is shown in FIG. 4. As can be seen from the figure, for dopant levels above about $5 \times 10^{20}$ cm$^{-3}$ elastic scattering from dopant ions is the dominant scattering mechanism for hot electrons in p-type GaAs, if the ions are randomly distributed. Similar results obtain for the other semiconductor materials referred to above.

In preferred embodiments of the invention the dopant atoms in the second region are not randomly distributed, as has been customary up to now, but are instead at least partially ordered, whereby the elastic scattering rate of the hot electrons can be significantly reduced. An exemplary technique for attaining such ordering in the direction parallel with the current flow is delta-doping (see, for instance, E. F. Schubert et al. *Physical Review B*, Vol. 36 (1987) pp. 1348–1351), whereby a spatially non-uniform distribution of dopant atoms is produced. Typically such a distribution comprises one or more thin "sheets" of highly doped material, the sheets being parallel to the emitter/base interface. Another exemplary technique for attaining ordering may comprise the formation of an ordered alloy (see A. Gomyo et al, *Physical Review Letters*, Vol. 60(25) (1988), pp. 2645-2648) in the second region. In this case the dopant atoms in the second region form part of the alloy's periodic lattice.

I have made a further discovery that can also contribute to improved characteristics of HETs. In such devices, it is typically required that the hot electrons that have transited the second region and have been transmitted through the second/third region interface also be able to travel through the remainder of the transit region (typically the collector depletion region) substantially without scattering.

In many prior art HETs a significant scattering mechanism in (100)-oriented III-V semiconductors is (intraband) intervalley scattering from the Γ to the X valley (those skilled in the art are familiar with this terminology). Electrons typically are injected into the Γ valley in the second region, and it is advantageous to keep the electrons in that valley throughout their traverse of the transit region. The likelihood of Γ→X intervalley scattering in the transit region can be significantly reduced if the average time the hot electrons spend in the part of the transit region in which Γ→X scattering is possible is less than the average scattering time for Γ to X scattering (designated $\tau_{\Gamma-X}$) in the semiconductor material. The relevant part of the transit region in which Γ→X scattering is possible depends on $V_{bc}$ and the thickness $Z_c$. With the base/collector reverse biased to $V_{bc}=1$ volt the portion of the third region in which Γ→X scattering can take place is about 0.79 $Z_c$ for GaAs and about 0.33 $Z_c$ for $In_{0.53}Ga_{0.47}As$. Since $\tau_{\Gamma-X}$ in many of the semiconductors of interest herein can be estimated to be of the order of about 50 fs, in most III-V semiconductors of interest herein $Z_c$ desirably is less than about 100 nm, in order to insure at least a relatively low Γ→X scattering probability in the transit region. For instance, if $Z_c \lesssim 50$ nm in GaAs then little Γ→X scattering takes place in the transit region for relevant values of $E_i$ and $V_{bc}$; for $In_{0.53}GA_{0.47}As$ the same is true if $Z_c \lesssim 70$ nm.

Thus, in some preferred devices according to the invention the third region comprises an undoped or relatively lightly doped portion of thickness $Z_c$ in contact with the second region, and a relatively highly doped portion that is spaced apart from the second region, with $Z_c$ being at most about 100 nm.

In preferred HETs according to the invention there are also limits on $V_{bc}$ (see FIG. 2). To avoid interband scattering the electrons can be accelerated in the third region only to an energy less than $E_{bw}$, the energy width of the conduction band in the third region. This implies that $eV_{bc,max} \lesssim E_{bw}-E_g-E_{F,e}-E_{F,h}$, where e is the electron charge, $V_{bc,max}$ is the maximum allowed $V_{bc}$, $E_g$ is the bandgap in the third region material, and $E_{F,e}$ and $E_{F,h}$ are, respectively, the Fermi energy of the electrons in the contact portion of the third region and of the holes in the second region. On the other hand, in order to achieve short transit times and thus, potentially, high cut-off frequencies, as well as high output impedance, it would be desirable to be able to use relatively large $V_{bc}$. In preferred devices according to the invention, the collector contact region is relatively heavily doped, exemplarily containing more than about $10^{19}$ cm$^{-3}$, preferably more than $5 \times 10^{19}$ cm$^{-3}$, dopant atoms. In particularly preferred HETs according to the invention the third region comprises a material which has relatively large $E_{bw}-E_g$ (relative to GaAs, which has $E_{bw} \sim 2.0$ eV and $E_g \sim 1.4$ eV) since such devices can have a relatively large operating voltage range of $V_{bc}$. Exemplarily, $In_{0.53}Ga_{0.47}As$ is such a material.

In an exemplary embodiment of the invention the emitter (11) is n-type InP ($5 \times 10^{17}$ cm$^{-3}$ dopant atoms, e.g., Si) and the base (12) and collector (13) are $In_{0.53}Ga_{0.47}As$. The thickness of the base layer ($Z_b$) is about 40 mm, and the thickness $Z_c$ of the collector depletion region (17) is about 70 nm. The base consists, in sequence, of a 5 nm thick, essentially undoped, set-back layer, followed by 6 δ-doped sheets, with 6 nm spacing between sheets, followed by another 5 nm set-back layer. Each δ-doped sheet contains $1 \times 10^{14}$ cm$^{-2}$ p-type dopant atoms (e.g., Be), resulting in an average dopant concentration of $2 \times 10^{20}$ cm$^{-3}$ in the relevant portion of the base layer. As will be appreciated, a δ-doped layer is at most a few atomic layers thick. The thus produced spatially non-uniform distribution of dopant atoms is expected to result in reduced elastic scattering of the hot electrons, as opposed to prior art HETs with randomly distributed dopant atoms in the base region. The n+ collector contact region is about 300 nm thick, with a dopant density of b $5 \times 10^{19}$ cm$^{-3}$. The device is produced by known techniques, exemplarily including MBE, lithography and plasma etching. Electrical contacts (14, 15, 16) are made by a conventional technique.

In a further exemplary embodiment of the invention a HET is made substantially as described above, except that $Al_{0.35}Ga_{0.65}As$ is used to form the emitter layer, and GaAs is used for base and collector, with $Z_c$ being 50 nm. In other embodiments the base layer contains 2 δ-doped sheets of p-type dopant atoms (areal density $3 \times 10^{14}$ cm$^{-2}$) instead of the previously described six. The sheets are 30 nm apart, resulting in an average dopant density of $2 \times 10^{20}$ cm$^{-3}$. This doping scheme is expected also to result in reduced elastic scattering.

The above referred to δ-doping produces a non-random distribution in the growth direction but normally would not result in ordering within the doped sheets. At least partial ordering within the doped sheets is expected to be obtainable by appropriate choice of deposition conditions. Such ordering is expected to result in further reduction of elastic scattering of the hot electrons, and therefore in improved device performance.

Deposition conditions that are expected to result in at least partial inplane ordering are a relatively low substrate temperature (typically less than about 500° C.) together with an overpressure (or underpressure) of an appropriate element in the growth atmosphere. For instance, if Be is the dopant then overpressure (the partial pressure typically being at least 150% of the normal partial pressure) of As ensures that the Be atoms will preferentially be located on Ga sites. On the other hand, if the dopant is C then an underpressure (the partial pressure typically being at most 75% of the normal partial pressure) of As, combined with the deposition of a fraction of a monolayer (e.g., about ½ monolayer) of Ga, ensures preferential location of C on As sites. The low substrate temperature prevents substantial surface diffusion of the deposited atoms, the procedure thus resulting in partial ordering of the dopant atoms. Partial ordering is currently considered to result in substantial reduction in $1/\tau_{el}$ if the Fourier transform of the distribution function for the dopant atoms has a value of at most 0.1 in the range $0 \leq k \leq k_i$, where $k_i$ is the average wave vector of the injected hot electrons.

Ordering that meets the above requirement will be referred to as "substantial" ordering. The distribution function can, at least in principle, be determined by known techniques such as scanning tunneling microscopy or electron diffraction.

"Partial ordering" in many herein relevant situations exists if the probability of finding a dopant atom on one type of lattice site (e.g., the Ga site in GaAs) is substantially different from the probability of finding such an atom on the other type of lattice site (e.g., the As site in GaAs).

I claim:

1. A bipolar hot electron transistor comprising
   (a) an electron emission region (the first region), an electron collection region (the third region), and a second region intermediate the first and third regions, forming interfaces and being epitaxial therewith, the first, second, and third regions each consisting of semiconductor material, with the composition of the second region material differing at least from that of the first region material at the first/second region interface, with at least a part of each of the first and third regions having n-type conductivity, and with at least a part of the second region having p-type conductivity, associated with the second region being a thickness $Z_b$, a base resistance $R_b$, an average dopant density $n_b$, and an inelastic scattering rate $1/\tau_{in}$ for the hot electrons;
   (b) means for making electrical contact with the first, second, and third regions, respectively; and
   (c) means adapted for causing injection of hot electrons of average energy $E_i$ from the first into the second region, with at least a substantial portion of the injected hot electrons crossing the interface between the second and third region;
   characterized in that
   (d) the inelastic scattering rate $1/\tau_{in}$ varies as a function of $n_b$ and has a maximum for a given value of $E_i$, with $n_b$ at the maximum to be referred to as $n_{b,max}$; and
   (e) $n_b$ is selected to be greater than $n_{b,max}$ and at least $10^{20}$ cm$^{-3}$, whereby the transistor can have a relatively small $Z_b$ and a relatively small base resistance $R_b$.

2. The transistor of claim 1, wherein the first region comprises n-type InP.

3. The transistor of claim 1, wherein the dopant atoms in the second region have a non-random distribution, whereby the elastic scattering rate ($1/\tau_{el}$) of the hot electrons is caused to be substantially lower than in an otherwise identical transistor in which the dopant atoms in the second region have an essentially random distribution.

4. The transistor of claim 3, wherein the non-random distribution comprises a spatially non-uniform distribution comprising one or more layers of relatively highly doped material with, in the case of more than one highly doped layer, a layer of undoped or relatively lightly doped material between any two adjacent highly doped layers.

5. The transistor of claim 3, wherein the non-random distribution comprises substantial ordering of the dopant atoms in at least a part of the second region.

6. The transistor of claim 5, wherein the part of the second region is a layr of relatively highly doped material that is separated from a similar layer by a layer of undoped or relatively lightly doped material.

7. The transistor of claim 1, wherein the third region comprises an undoped or relatively lightly doped portion of thickness $Z_c$ in contact with the second region, and a relatively highly doped portion that is spaced apart from the second region, with $Z_c$ being at most about 100 nm.

8. The transistor of claim 7, wherein the relatively highly doped portion contains a concentration of at least about $10^{19}$ dopant atoms/cm$^3$.

9. The transistor of claim 1, wherein at least the third region comprises a compound semiconductor material having a conduction band width $E_{bw}$ and a bandgap width $E_g$, with the material selected such that $E_{bw}-E_g$ is substantially larger than $E_{bw}-E_g$ of GaAs.

10. The transistor of claim 1, wherein
   (i) $n_b$ is at least about $2\times 10^{20}$ cm$^{-3}$;
   (ii) the dopant atoms in the second region have a spatially nonuniform distribution comprising at least two layers of relatively highly doped material with a layer of undoped or relatively lightly doped material therebetween;
   (iii) the dopant atoms in the at least two layers are substantially ordered;
   (iv) the third region comprises an undoped or relatively lightly doped portion of thickness $Z_c$ that is in contact with the second region, with $Z_c$ being at most about 100 nm;
   (v) the third region further comprises a relatively highly doped portion that is spaced apart from the second region and contains at least about $10^{19}$ dopant atoms/cm$^3$; and
   (vi) the second and third regions consist essentially of a compound semiconductor material having a conduction band width $E_{bw}$ and a bandgap energy $E_g$ such that $E_{bw}-E_g$ is greater than about 0.6 eV.

* * * * *